(12) United States Patent
Rooney

(10) Patent No.: US 11,417,387 B2
(45) Date of Patent: Aug. 16, 2022

(54) RESERVED ROWS FOR ROW-COPY OPERATIONS FOR SEMICONDUCTOR MEMORY DEVICES AND ASSOCIATED METHODS AND SYSTEMS

(71) Applicant: Micron Technology, Inc., Boise, ID (US)

(72) Inventor: Randall J. Rooney, Boise, ID (US)

(73) Assignee: Micron Technology, Inc., Boise, ID (US)

(*) Notice: Subject to any disclaimer, the term of this patent is extended or adjusted under 35 U.S.C. 154(b) by 130 days.

(21) Appl. No.: 17/013,520

(22) Filed: Sep. 4, 2020

(65) Prior Publication Data

US 2022/0076731 A1    Mar. 10, 2022

(51) Int. Cl.
    *G11C 11/408*     (2006.01)
    *G11C 11/4096*    (2006.01)
    *G11C 11/4091*    (2006.01)
    *G11C 11/4093*    (2006.01)

(52) U.S. Cl.
    CPC ...... *G11C 11/4085* (2013.01); *G11C 11/4087* (2013.01); *G11C 11/4091* (2013.01); *G11C 11/4093* (2013.01); *G11C 11/4096* (2013.01)

(58) Field of Classification Search
    CPC ............ G11C 11/4087; G11C 11/4091; G11C 11/4096

USPC ........................................................ 365/149
See application file for complete search history.

(56) References Cited

U.S. PATENT DOCUMENTS

| | | | |
|---|---|---|---|
| 6,542,407 B1 * | 4/2003 | Chen | G11C 16/3418 365/185.17 |
| 2017/0287547 A1 * | 10/2017 | Ito | G11C 29/783 |
| 2019/0056874 A1 * | 2/2019 | Lee | G06F 3/0679 |

* cited by examiner

*Primary Examiner* — Anthan Tran
(74) *Attorney, Agent, or Firm* — Perkins Coie LLP

(57) ABSTRACT

Methods, systems, and apparatuses for memory devices (e.g., DRAM) including one or more reserved rows for row-copy operations are described. Such a memory device may include a memory array having a set of rows, where one or more rows of the set are reserved for row-copy operations and hidden (un-addressable) from access commands directed to the memory array. The reserved rows may include a dummy row configured to provide a uniform processing conditions to the memory array. Additionally, or alternatively, the reserved rows may include a buffer row configured to provide a buffer zone in the memory array. In some embodiments, the memory device may perform the row-copy operations in response to detecting row hammering activities. The row-copy operations may mitigate the risks associated with the row hammering activities by routing the row hammering activities to the reserved rows.

20 Claims, 6 Drawing Sheets

RESERVED ROWS FOR ROW-COPY OPERATIONS FOR SEMICONDUCTOR MEMORY DEVICES AND ASSOCIATED METHODS AND SYSTEMS

TECHNICAL FIELD

The present disclosure generally relates to semiconductor memory devices, and more specifically, relates to reserved rows for row-copy operations for semiconductor memory devices, and associated methods and systems.

BACKGROUND

Memory devices are widely used to store information related to various electronic devices such as computers, wireless communication devices, cameras, digital displays, and the like. Memory devices may be volatile or non-volatile and can be of various types, such as magnetic hard disks, random access memory (RAM), read only memory (ROM), dynamic RAM (DRAM), synchronous dynamic RAM (SDRAM), and others. Information is stored in various types of RAM by charging a memory cell to have different states. Improving RAM memory devices, generally, can include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

The present disclosure will be understood more fully from the detailed description given below and from the accompanying drawings of various embodiments of the disclosure. The components in the drawings are not necessarily to scale. Instead, emphasis is placed on illustrating clearly the principles of the present technology.

DETAILED DESCRIPTION

Figure 1:
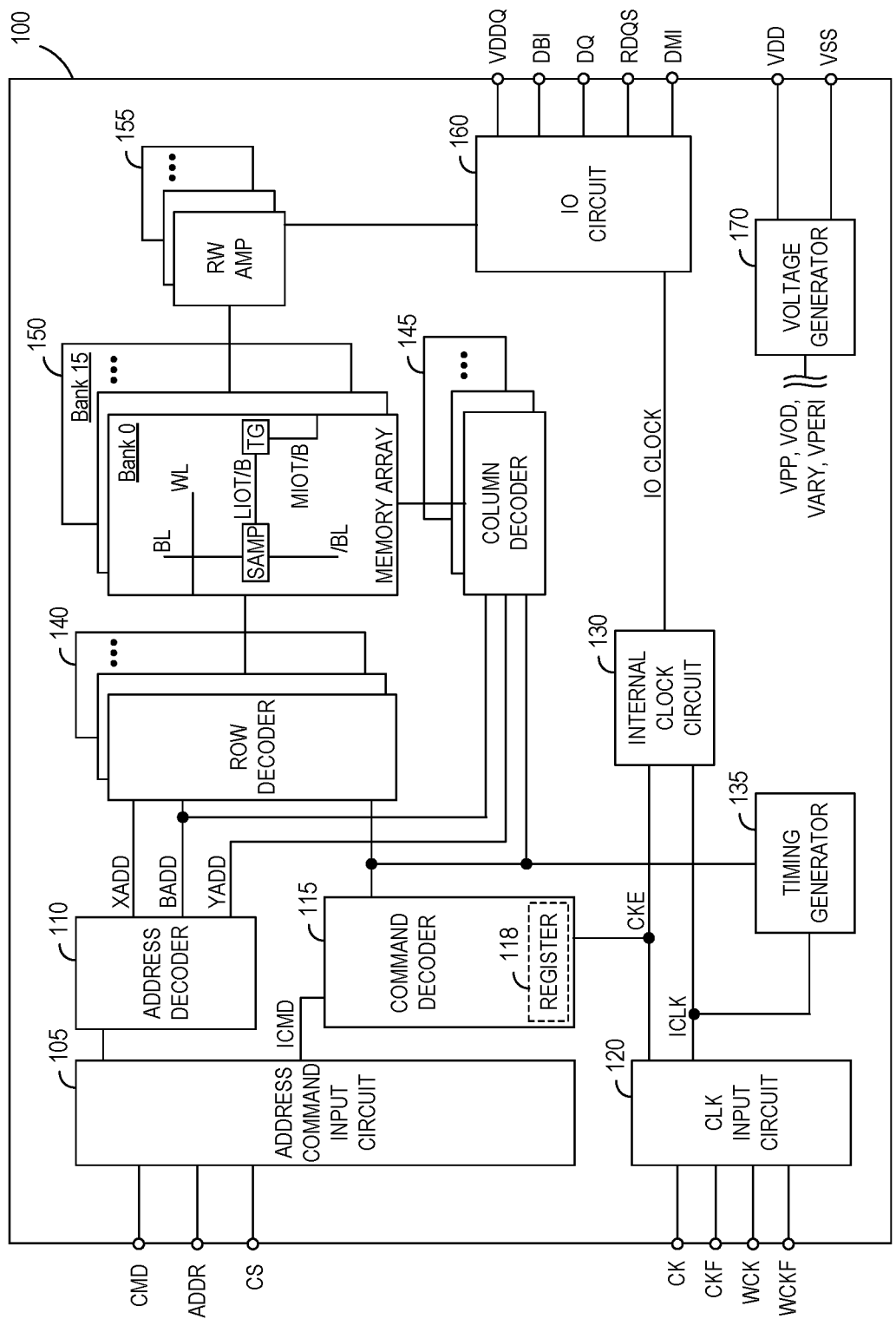
FIG. 1 is a simplified block diagram schematically illustrating a memory device that supports embodiments of the present technology.

Methods, systems, and apparatuses for semiconductor memory devices (e.g., DRAM) are disclosed, which perform row-copy operations using one or more rows reserved for the operations. Some semiconductor memory devices, such as DRAM, store information as charge accumulated in cell capacitors coupled with word lines (rows) through switching transistors. The charge accumulated in the cell capacitors tends to escape (which may be referred to as "leakage") to surrounding components connected to the cell capacitors (e.g., metal lines, semiconductor junctions of the switching transistors), due to voltage differences between the cell capacitors and the surrounding components. In certain instances, such leakage may be exacerbated when a row of memory cells experiences "row hammering," which refers to a row of memory cells being repeatedly driven to an active level within a certain duration (e.g., over a duration less than that between sequential refresh operations). Row hammering may accelerate the leakage in memory cells coupled with rows (the victim rows) that are adjacent to the row experiencing the row hammering (the aggressor row).

Risks associated with row hammering activities (e.g., memory cells coupled with the victim rows losing their information) may be mitigated by using a row-copy operation in accordance with the present technology. For example, the memory device may determine row hammering activities occurring on a row (e.g., an aggressor row experiencing repeated access operations by a host device) and generate a duplicate copy of data from the row to a row reserved for the row-copy operation (a reserved row). Subsequently, the memory device may internally route the row hammering activities to the reserved row such that access operations directed to the aggressor row can now be executed on the reserved row—e.g., outputting data stored in the memory cells of the reserved row in response to a read operation received by the host device. Rows adjacent to the reserved row may still suffer the leakage induced by the row hammering activities, but those adjacent rows may be configured to store null data (e.g., a series of 1s or 0s, random collections of 1s and 0s) or to be in an electrically stable (e.g., locked) condition. In this manner, the memory device may avoid losing valid data (e.g., user data, metadata regarding other data related to various operational aspects of the memory device, etc.) should row hammering activities occur.

In some embodiments, such a reserved row may be designated within a memory array ("active" memory array) configured to write (store) data (e.g., user data). In such embodiments, the capacity of the memory array (hence the storage capacity of the memory device), however, would be reduced because addresses associated with the reserved row (and the adjacent victim rows) may not be used to store the data due to the risks associated with row hammering. The present technology facilitates using extra rows present in the memory device for the row-copy operation without reducing the storage capacity of the memory device. For example, the memory device may use one of the extra rows as a temporary repository for the data of the aggressor row and direct the row hammering activities to the extra row containing the data. Accordingly, the memory device may prevent (or mitigate) the risks associated with the row hammering that may adversely impact the victim rows of the active memory array. The extra rows, which may be referred to as dummy rows, may be present at or near boundaries of the active memory array to ensure proper formation of the memory cells in the active memory array during processing steps. Additionally, or alternatively, the extra rows may be present between the active memory array and a group of redundancy rows.

Figure 3A:
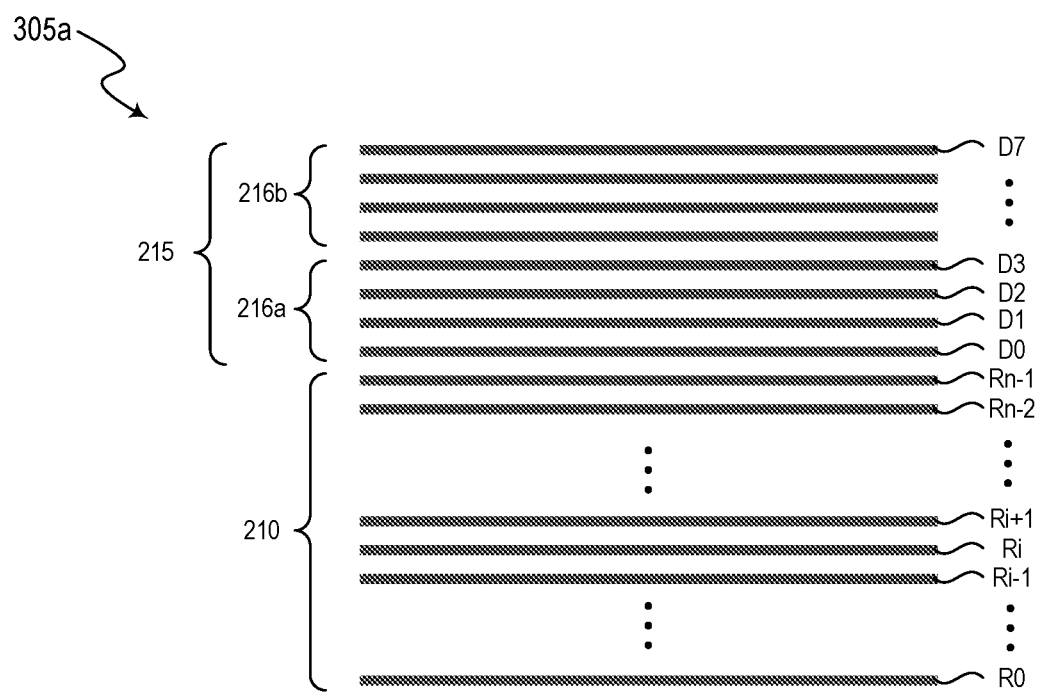
FIGS. 3A and 3B are example array configurations including reserved rows for row-copy operations in accordance with an embodiment of the present disclosure.
Figure 3B:
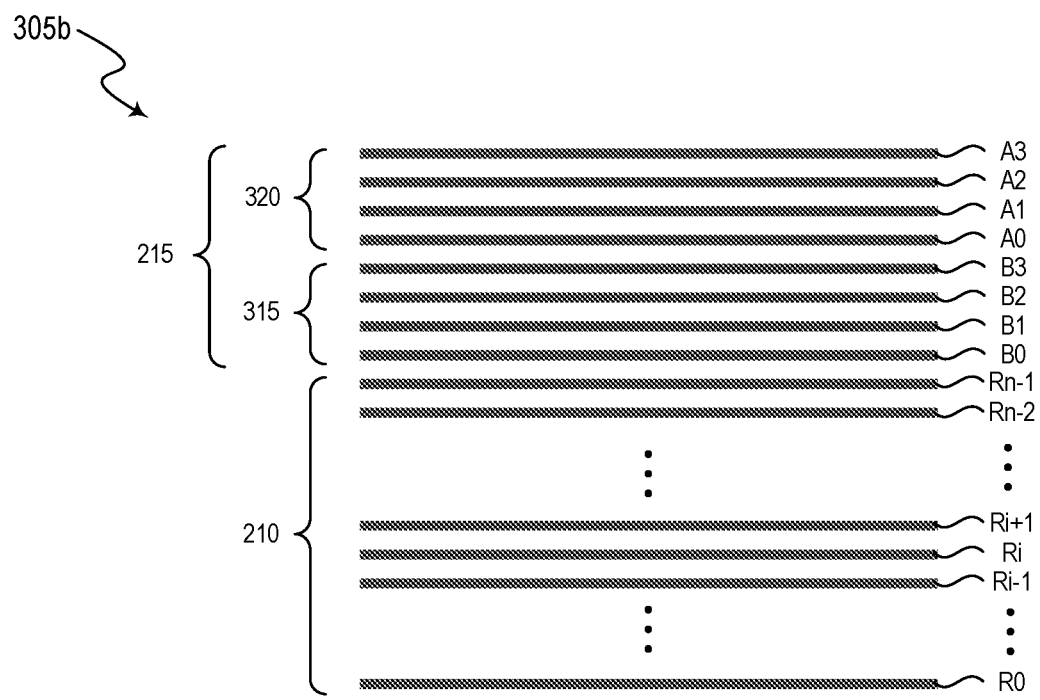
Figure 4:
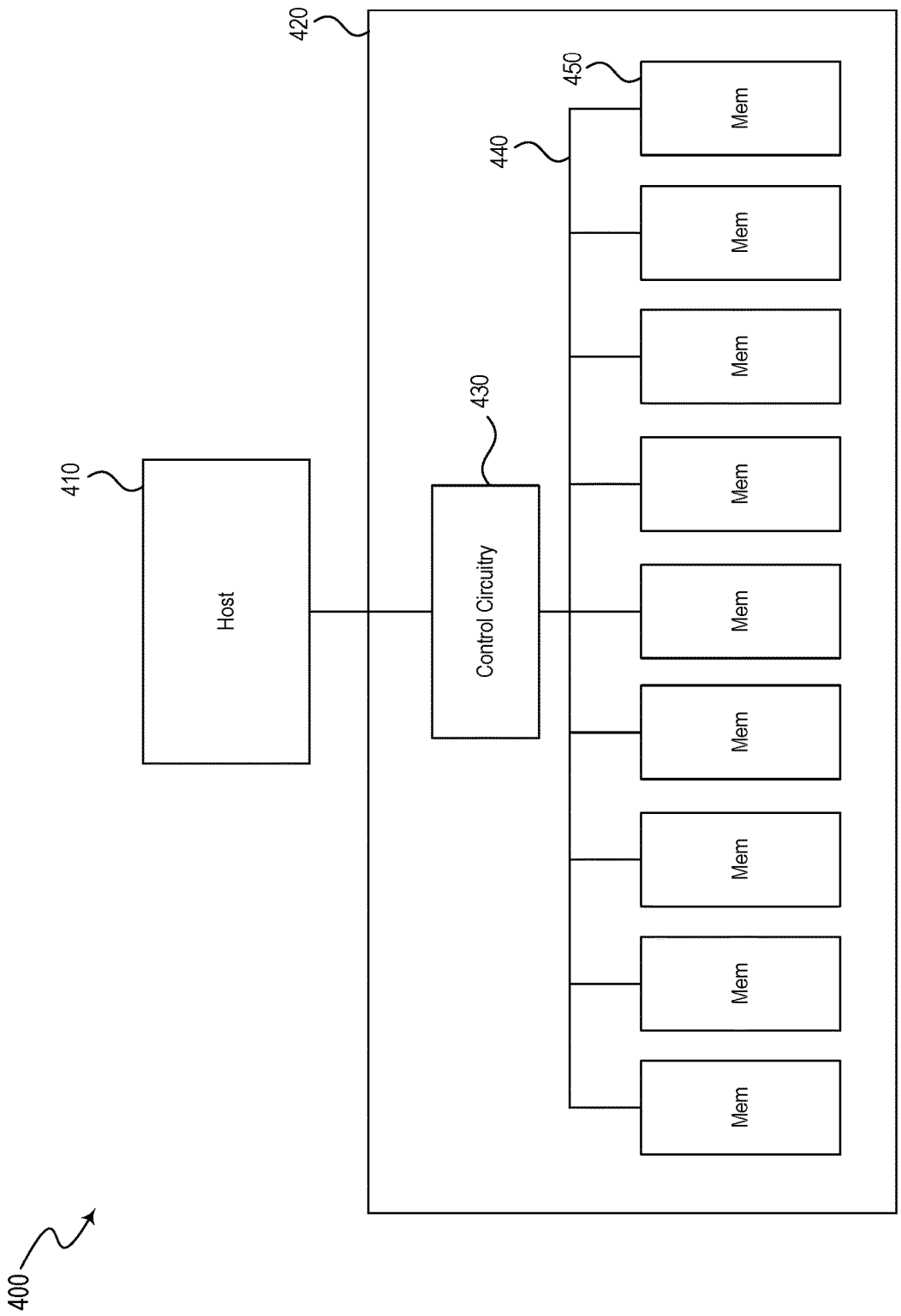
FIG. 4 is a simplified block diagram schematically illustrating an example memory system in accordance with an embodiment of the present disclosure.
Figure 5:
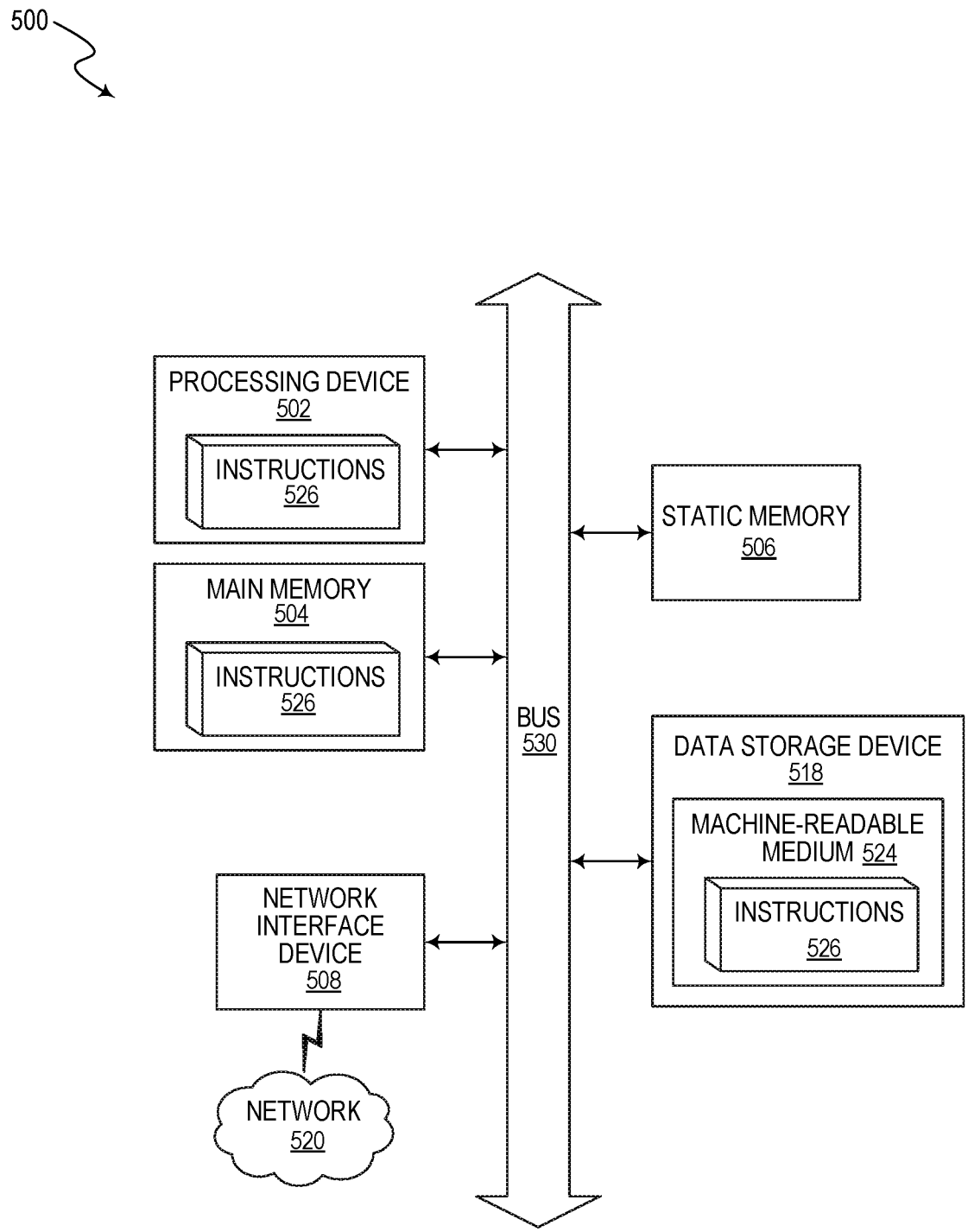
FIG. 5 is a block diagram of an example computer system in accordance with an embodiment of the present disclosure.

An example block diagram of a memory device in accordance with an embodiment of the present technology is described in FIG. 1. Various components of the memory device for performing the row-copy operations in accordance with embodiments of the present disclosure are described in FIG. 2. FIGS. 3A and 3B illustrates memory array configurations to describe how extra rows may be utilized to mitigate risks related to the row hammering activities. FIGS. 4 and 5 describes an example memory system and an example computer system in accordance with embodiments of the present disclosure. A method for performing row-copy operations in accordance with an embodiment of the present disclosure is described in FIG. 6.

FIG. 1 is a simplified block diagram schematically illustrating a memory device 100 that supports embodiments of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. In some cases, word lines may be referred to as rows, and bit lines may be referred to as columns and/or data lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least one respective main I/O line pair (MIOT/B), via transfer gates (TG), which can function as switches.

The memory array 150 may include dummy word lines (WLs) and/or dummy bit lines (BLs) at or near physical boundaries of the memory array 150. Dummy word lines and dummy memory cells coupled therewith may be laid out structurally identical when compared to "live" word lines and "live" memory cells coupled therewith. During various process steps manufacturing the memory array 150, processing conditions (e.g., etching gas chemistry, chemical-mechanical planarization (CMP) process parameters, photolithography exposure conditions) may be influenced by patterns present on the memory device 100. As such, absent the dummy word lines (and/or dummy bit lines), the processing conditions may be non-uniform across the physical boundaries of the memory array 150. Such non-uniformities in the processing condition may result in different physical and/or electrical characteristics of the memory cells proximate to the physical boundary versus the memory cells well away from the physical boundary.

The presence of dummy word lines disposed adjacent to the physical boundary may provide uniform processing conditions for the "live" word lines proximate thereto such that those "live" word lines (and memory cells coupled therewith) can be formed generally identical to other "live" word lines (and memory cells coupled therewith) of the memory array 150. For example, the dummy word lines can provide uniform pitches (e.g., constant pitches) for various patterning features (e.g., layout patterns for gate, contact, diffusion, or the like) for the "live" word lines beyond the physical boundary. In this regard, the dummy word lines extends (or maintains) the uniform processing conditions beyond the physical boundary. Certain dummy word lines (e.g., dummy word lines near the "live" word lines) may include fully functional dummy memory cells that are capable of storing data.

Additionally, or alternatively, the memory array 150 may include a group of word lines reserved to repair (e.g., replace) one or more "live" word lines that are determined to be non-functional ("defective"). The group of word lines may be referred to as redundant word lines. The memory array 150 may further include additional rows between the "live" word lines and the redundant word lines. Such additional rows may provide a buffer zone therebetween to mitigate the risks of the row hammering activities, and may be referred to as buffer rows. For example, absent the buffer zone, the last "live" row adjacent to one of the redundant rows may be subject to the row hammering (hence, becoming the aggressor row). As described above, the redundant rows adjacent to the aggressor row may suffer leakage as a result of the row hammering activities, putting the information stored in the memory cell coupled with the redundant row at risk. Accordingly, the buffer rows provide spacing between the "live" word lines and the redundant word lines. The memory cells coupled to the buffer rows may be electrically tested and refreshed but may not be configured to store data.

The memory device 100 may be configured to reserve one or more dummy rows and/or buffer rows for row-copy operations to provide temporary locations to collect the row hammering activities away from the "live" word lines. Dummy (and/or buffer) rows adjacent to the reserved dummy (and/or buffer) rows can be configured to store null data or to maintain otherwise stable conditions and the memory device 100 may not need to control or respond to changes to the memory cells coupled therewith. As described in more detail herein, the reserved dummy (and/or buffer) rows may be internally addressable for the memory device but hidden or un-addressable from a host device coupled with the memory device 100. In other words, the reserved dummy (and/or buffer) rows may be driven by row drivers coupled with a row decoder configured to identify the reserved dummy (and/or buffer) rows based on a signal generated by the memory device 100.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI (for data bus inversion function), and DMI (for data mask inversion function), power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address portion of the ADDR input and supply the decoded bank address signal (BADD) and supply the bank address signal to both the row decoder 140 and the column decoder 145.

The command and address terminals may be supplied with command signals CMD, address signals ADDR, and chip select signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK (not shown in FIG. 1).

The command decoder 115, in some embodiments, may further include one or more registers 118a for tracking various counts or values (e.g., counts of refresh commands received by the memory device 100 or self-refresh operations performed by the memory device 100). In some embodiments, a subset of registers 118a may be referred to as mode registers and configured to store user-defined variables to provide flexibility in performing various functions, features, and modes. For example, the memory device may operate under a test mode based on the status of mode registers.

When a read command is issued to a bank with an open row and a column address is timely supplied as part of the read command, read data can be read from memory cells in the memory array 150 designated by the row address (which may have been provided as part of an Activate command identifying the open row) and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (e.g., the register 118a). The read latency information RL can be defined in terms of clock cycles of the CK clock signal. For example, the read latency information RL can be a number of clock cycles of the CK signal after the read command is received by the memory device 100 when the associated read data is provided.

When a write command is issued to a bank with an open row and a column address is timely supplied as part of the write command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (e.g., register 118a). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command decoder 115.

For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Figure 2:
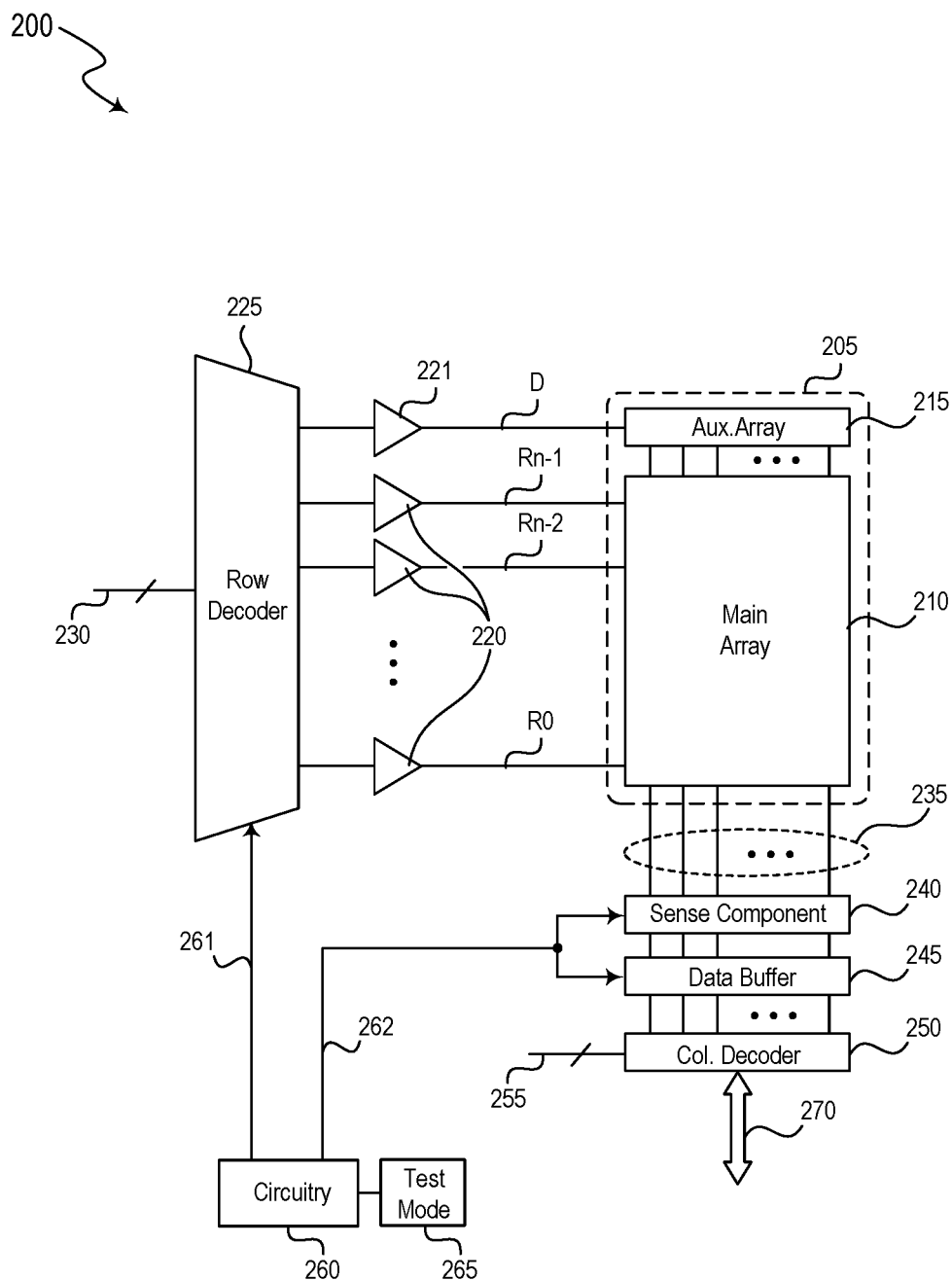
FIG. 2 is a simplified block diagram of an example memory device illustrating various components for performing row-copy operations in accordance with an embodiment of the present disclosure.

FIG. 2 is a simplified block diagram of a memory device 200 illustrating various components for performing row-copy operations in accordance with an embodiment of the present technology. The memory device 200 may be an example of or include aspects of the memory device 100 described with reference to FIG. 1. For example, the memory device 200 may include a memory array 205, a plurality of row drivers 220, an auxiliary row driver 221, a row decoder 225, a sensing component 240 (including one or more sense amplifiers), a data buffer 245, a column decoder 250, peripheral circuitry 260, and a test mode component 265, among others.

The memory array 205 may be an example of or include aspects of the memory array 150. Further, the memory array 150 is shown to include a main array 210 and an auxiliary array 215. Although the main array 210 and the auxiliary array 215 are depicted to include a gap for illustration purposes, structural configurations (e.g., layout of the arrays) between the main array 210 and the auxiliary array 215 are designed to be identical as shown in FIGS. 3A and 3B, and there may not be a physical gap (or spacing) other than a space between rows. The memory array 205 may be organized in groups of rows. Namely, the main array 210 may include a first group of rows (e.g., rows R0 through Rn−1) configured to store data (e.g., user data) provided by a host device coupled with the memory device 200. The auxiliary array 215 may include a second group of rows and at least one row (e.g., a row shown and identified as a row "D") of the second group may be reserved to copy the data from any row of the first group.

Further, the memory array 205 may include a group of columns 235. The group of columns 235 is common to the main array 210 and the auxiliary array 215. By way of example, the main array 150 may include 1,024 rows and 512 columns, which correspond to half-mega bit storage capacity. Although the memory device 200 is depicted to have a single memory array 205 to illustrate clearly the principles of the present technology, the memory device 200, in other embodiments, can have more than one such memory arrays such that the memory device 200 can provide much greater storage capacity than the half-mega bits—e.g., 32 giga-bits, 64 giga-bits, or even greater. In some cases, the memory array 205 depicted in FIG. 2 may be referred to as a memory section that shares a common sensing component (e.g., the sensing component 240) between the main array 210 and the auxiliary array 215. If the memory device 200 is configured to include more than one such memory arrays (memory sections), the memory arrays may be further organized into one or more banks and/or bank groups.

Each of the rows of the first group may be coupled with corresponding row drivers 220 configured to drive individual rows coupled thereto. Further, the at least one row of the second group may be coupled with the auxiliary row driver 221. Both the row drivers 220 and the auxiliary row driver 221 may be driven by the row decoder 225 (which may be an example of or include aspects of the row decoder 140). In this manner, based on the row address information 230 provided to the row decoder 225 (e.g., XADD described with reference to FIG. 1), the row decoder 225 may select one of the row drivers 220 to activate a row of the first group (e.g., one of the rows R0 through Rn−1). Further, the peripheral circuitry 260 may internally generate a signal 261 that includes information identifying a particular memory section (if there are more than one memory sections) and a particular auxiliary row driver 221 of the particular memory section. The peripheral circuitry 260 may transmit the signal 261 to the row decoder 225 such that the row decoder 225, in response to receiving the signal 261, can select the auxiliary row driver 221 to activate the at least one row of the second group. As such, the at least one row of the second group is internally addressable within the semiconductor device 200, but hidden (un-addressable) from the host device—e.g., XADD lacking information to direct the row decoder 225 to select the auxiliary row driver 221.

The sensing component 240 (e.g., sense amplifiers) may be configured to couple with the rows of the first group (e.g., rows of the main array 210) and the rows of the second groups (e.g., rows of the auxiliary array 215). In other words, the sensing component 240 is shared by the main array 210 and the auxiliary array 215, and the main array 210 and the auxiliary array 215 may be regarded to be present within a physical boundary of a memory section that shares the sensing component 240. In some embodiments, one or more such memory sections (e.g., the memory array 205) may be included in the memory banks described with reference to FIG. 1. Thus, the memory device 200 may include multiple memory sections, one of which is illustrated in FIG. 2. In some embodiments, the sensing component 240 may include a plurality of sense amplifiers configured to couple with the rows of the first and second groups such that the sense amplifiers can access (e.g., read, write) data from any row of the first and second groups.

Further, the sensing component 240 may be coupled with a data buffer 245. In some embodiments, the data buffer 245 may be regarded as part of the sensing component 240. Further, the sense amplifiers of the sensing component 240 may latch (e.g., save) data at the data buffer 245 (e.g., data read (retrieved) from a row of the memory array 205, date to be stored (written) to a row of the memory array 205). During a read operation, the sensing component 240, in conjunction with the peripheral circuitry 260, may save (e.g., latch) the data retrieved from the memory array 205 into the data buffer 245. Similarly, during a write operation, the sensing component 240, in conjunction with the peripheral circuitry 260, may move the data from the data buffer 245 to the memory array 205 to write (store) the data in the memory array 205.

The data buffer 245 may be further coupled with a column decoder 250 (which may be an example of or include aspects of the column decoder 145). The column decoder 250 may be configured to, based on the column address information 255 provided to the column decoder 250 (e.g., YADD described with reference to FIG. 1), select a subset of columns at a time to output (or input) the data to (or from) data bus 270 (which, in turn, may be coupled with the input/output circuit 160 described with reference to FIG. 1). For example, during a read operation, the column decoder 250 may select sixteen (16) columns out of 512 columns at a time—e.g., identified by a column address. As such, a total of thirty-two (32) cycles of outputting data from the data buffer 245 to the data bus 270 would be necessary to output a total of 512 bits from a row of the memory array 205.

The peripheral circuitry 260 may be configured to determine that a row of the first group (e.g., the main memory 210) is accessed repeatedly—e.g., row hammering activities occurring in the main array 210. The peripheral circuitry 260 may further determine to perform the row-copy operation as described herein—e.g., copy the data from the row of the main memory 210 to a reserved row of the auxiliary memory 215. Accordingly, the peripheral circuitry 260 may activate (e.g., open) the row of the first group (e.g., the aggressor row) coupled with a first plurality of memory cells (e.g., 512 memory cells). The peripheral circuitry 260 may read (retrieve) data from the first plurality of memory cells via the sensing component 240, and save (or latch) the data in the data buffer 245.

Thereafter, the peripheral circuitry 260 may also activate a reserved row of the second group (e.g., the auxiliary array 215) coupled with a second plurality of memory cells (e.g., 512 memory cells) such that the peripheral circuitry 260 can store the data (e.g., the data from the main array 210) in the second plurality of memory cells via the sensing component 240. In this regard, the peripheral circuitry 260 may concurrently store the data in the first and second pluralities of memory cells through the sensing component because both the row of the main array 210 and the reserved row of the auxiliary array 215 have been activated (e.g., memory cells coupled to the rows are "open" to the sensing component 240). Subsequently, the peripheral circuitry 260 can deactivate (e.g., "close" the memory cells) both the row of the main array 210 and the reserved row of the auxiliary array 215. In this manner, the peripheral circuitry 260 completes the row-copy operation such that the first and second pluralities of memory cells include the same data (i.e., identical data).

Moreover, the peripheral circuitry 260 may be coupled with a test mode component 265. The test mode component 265 may be configured to manage various test mode functions that are accessible only by the manufacturer of the memory device 200—e.g., accessing a fuse array of the memory device 200, temporarily evaluating certain operations or features of the memory device 200, etc. For example, the memory device 200, in conjunction with the test mode component 265, may test functionality of the memory cells within the auxiliary array 215.

As described herein, the peripheral circuitry 260 performs the row-copy operation within the memory array 205 (e.g., within a memory section sharing a common sensing component) without activating the data bus 270 of the memory device 200. In other words, the data read (retrieved) from the main array 210 is saved (latched) at the data buffer 245 while the peripheral circuitry 260 activates (opens) the reserved row in the auxiliary array 215. Subsequently, the peripheral circuitry 260 stores (writes) the data that have been saved in the data buffer 245 back to the main array 210, and to the reserved row at the same time. As such, the row-copy operation described herein does not incur activating the column decoder 250 to output the data to the data bus 270 over multiple cycles (e.g., 32 cycles to transfer 16 bits each time to output 256 bits of data)—e.g., sequencing through multiple column addresses to output the entire set of data from the row.

The present technology facilitates the memory device 200 to perform the row-copy operation in a highly efficient manner, which may be utilized for other functions. For example, the memory device 200 may perform post-package repair (PPR) operations if one or more rows of the memory array are determined to be defective after the memory device 200 has been implemented in a system (e.g., a memory system, a computer system). In some embodiments, the memory device 200 may repair (replace) the one or more defective rows of the memory array with rows of a redundancy plane (redundant rows) of the memory device as described in more detail below with reference to FIG. 3B. Moreover, the memory device 200 may, in conjunction with the test mode component 265 in some cases, program a non-volatile memory component (e.g., a fuse array) to store a mapping information between the one or more defective rows and the redundant rows replacing the defective rows such that the mapping information can be retained without power. In some cases, such PPR operations may be referred to as hard PPR operations that require an extensive period of time to complete—e.g., entering into a test mode to access the fuse array, programming the fuse array, etc.

The row-copy operation in accordance with embodiments of the present technology may provide an alternative that is more efficient than the hard PPR operations. For example, if the memory device 200 determines one or more rows of the main array 210 need to be replaced (e.g., requiring a PPR operation), in conjunction with a host device coupled with the memory device 200 in some cases, the memory device 200 can copy the contents of the one or more rows of the main array 210 to the rows of the auxiliary array 215 using the row-copy operation described herein. In some cases, such row-copy operations may be referred to as soft PPR operations in view of omitting to generate the non-volatile mapping information (e.g., programming the fuse array). When compared to the hard PPR operations, the soft PPR operations may be accomplished in a much reduced period of time (e.g., almost instantaneously when compared to the hard PPR operations) because the row-copy operations can be accomplished within a section of memory array that shares a common sensing component, not to mention programming the fuse array. In some embodiments, the host device may maintain the mapping information such that, if the memory device 200 experiences power off and on cycles, the host device can restore the mapping relationship between the defective rows of the main array 210 and the rows of the auxiliary array 215.

FIG. 3A is an example memory array 305a including one or more reserved rows for row-copy operations in accordance with an embodiment of the present disclosure. The memory array 305a may be an example of or include aspects of the memory array 205. For example, a first group of rows R0 through Rn−1 may correspond to the main array 210, and the second group of rows D0 through D7 may correspond to the auxiliary array 215. The memory array 305a depicted in FIG. 3A may be regarded as a layout of the rows (word lines) of the memory array 305a. Each of the rows D0 through D7 (and associated memory cells and columns, not shown) are designed (e.g., laid out) to be identical with the rows R0 through Rn−1. As such, the rows (and memory cells coupled thereto) of the auxiliary array 215 may appear physically (and/or structurally) identical to the rows (and memory cells coupled thereto) of the main array 210—on the layout of the memory array 305a.

During various processing steps to manufacture the memory array 305a, however, processing conditions (e.g., etching gas chemistry, chemical-mechanical planarization (CMP) process parameters, photo-lithography exposure conditions) may be influenced by patterns present on a memory device including the memory array 305a. For example, the processing conditions outside a physical boundary (border) of the memory array 305a (e.g., outside the row D7) may be different from the processing conditions that edge rows of the memory array 305a (e.g., the rows D7 through D4 or D3) may experience. Further, the processing conditions may reach a steady-state for the rows located further inside of the memory array 305a than the edge rows. As a result, the rows (and memory cells coupled thereto) at the edge (or near the edge) of the memory array 305 may include different physical attributes (e.g., line widths and/or spaces, undulations and/or waviness) compared to the rows located away from the edge, after completing the manufacturing process.

In some cases, such non-uniformities between rows near the edge and the rest may be referred to as a proximity effect. The proximity effect may be transient in nature. In other words, the proximity effect may wear out (e.g., reduces, reaches a steady-state) from the edge toward the center of the memory array 305a. For example, the proximity effect may affect first three or four edge rows (depending on various processing environments) such that the fifth row from the edge may be generally identical to any rows further away from the edge.

Accordingly, the rows of the auxiliary array 215 may be disposed next to (e.g., adjacent to) the main array 210 such that the rows of the main array 210 can be free from the proximity effects. Absent the rows in the auxiliary array 215, several rows of the main array 210 (e.g., Rn−1 through Rn−3 or Rn−4) may have different physical attributes than the rows away from the edge (e.g., Ri−1, Ri, Ri+1). As a result, certain memory cells of the edge rows may include different electrical characteristics when compared to the memory cells of the rows away from the edge. In some cases, the memory cells of the edge rows may not be functional at all. Hence, the rows of the auxiliary array 215 can be regarded as providing a uniform processing condition to the rows of the main array 210 during a process step to manufacture the memory array 305a. For example, the rows of the auxiliary array 215 (e.g., rows D0 through D7) can provide uniform pitches (e.g., constant pitches) for various patterning features (e.g., layout patterns for gate, contact, diffusion, or the like) for the "live" rows of the main array 210—e.g., Rn−1, Rn−2, etc. near the physical boundary of the main array 210. In this regard, the dummy word lines extend (or maintain) the uniform processing conditions beyond the physical boundary of the main array 210. Further, the rows of the auxiliary array 215 (e.g., row D7) may define a physical boundary of the memory array 305a. Although the memory array 305a does not show another set of auxiliary array next to the row R0, one skilled in the art will readily appreciate that another set of auxiliary array would be disposed next to (e.g., adjacent to) the row R0 to prevent the proximity effect from affecting the row R0 (and several rows next to R0, including R1 through R3 or R4) of the main array 210.

In some embodiments, the row of the auxiliary array 215 may be provided (e.g., formed) in a set of multiple rows (which may be referred to as a row-group). For example, the four (4) rows of D0 through D3 are provided as a row group 216a, which is included in the auxiliary array 215. Additionally, another four (4) rows of D4 through D7 may be provided as another row group 216b, which is also included in the auxiliary array 215. In different embodiments, the row group may include a different quantity of rows—e.g., two (2), eight (8), or even more. In some embodiments, the quantity of rows of the auxiliary array 215 may be determined based on the transient nature of the proximity effects. For example, if the proximity effects influence the first two or three edge rows, the auxiliary array 215 may include one row group having four rows (e.g., the row group 216a). In another example, if the proximity effects influence the first four or five edge rows, the auxiliary array 215 may include two row groups that each have four rows (e.g., the row groups 216a and 216b). In some cases, such rows of the auxiliary array 215 may be referred to dummy rows as the rows of the auxiliary array 215 may not be used for storing data (e.g., user data).

In some embodiments, certain dummy rows may be free from the transient proximity effect and include fully functional memory cells coupled thereto. For example, dummy rows D7 through D3 may be influenced by the proximity effect, but dummy rows D2 through D0 may be free from the proximity effect, namely, memory cells coupled to dummy rows D0, D1, and D2 may be fully functional. Thus, at least one functional dummy row (e.g., either D1 or D2) may be reserved for the row-copy operation as described with reference to FIG. 2. In this regard, the memory device (e.g., the memory device 200) including the memory array 305a may be configured to electrically test memory cells of the dummy rows. For example, under a test mode (e.g., in conjunction with the test mode component 265), the memory device may test functionality of memory cells of each dummy rows. Thus, each dummy row may be coupled to a row driver, one of which (e.g., the auxiliary row driver 221) is illustrated in FIG. 2 as an example.

As described herein, the memory device may determine row hammering activities directed to one of the rows in the main array 210—e.g., the row Ri (the aggressor row). As a result of the row hammering activities directed the row Ri, data stored in the memory cells coupled to the row Ri+1 and the row Ri−1 (the victim rows) may be at risk. Thus, the memory device may perform a row-copy operation to copy the data stored in the memory cells of the aggressor row (i.e., the row Ri) to the dummy row D1 including fully functional memory cells. Subsequently, the memory device may route access operations related to the row hammering activities to execute on the dummy row D1 having the duplicate copy of the data from the row Ri (the aggressor row). Accordingly, the row Ri is no longer the aggressor row as the dummy row D1 becomes a new aggressor row. As the neighboring dummy rows (e.g., the dummy rows D0 and D2) do not store valid data (e.g., by storing null data or maintaining otherwise stable conditions), risks associated with the row hammering activities can be avoided (reduced, averted, or otherwise mitigated) even if the new victim rows D0 and D2 suffer from the row hammering activities.

FIG. 3B is an example memory array 305b including one or more reserved rows for row-copy operations in accordance with an embodiment of the present disclosure. The memory array 305b may include aspects of the memory array 305a and the array 205. For example, a first group of rows R0 through Rn−1 may correspond to the main array 210. Further, a second group of rows B0 through B3 and a third group of rows A0 through A3 may correspond to the auxiliary array 215. The memory array 305b depicted in FIG. 3B may be regarded as a layout of the rows (word lines) of the memory array 305b. Each of the rows B0-B3 and A0-A3 (and associated memory cells and columns, not shown) are designed (e.g., laid out) to be identical with the rows R0 through Rn−1. As such, the rows (and memory cells coupled thereto) of the auxiliary array 215 may appear physically identical to the rows (and memory cells coupled thereto) of the main array 210—on the layout of the memory array 305b. Moreover, another set of dummy rows (e.g., dummy rows D0-D7 described with reference to FIG. 3A) may be disposed next to the row A3 to protect the rows A0-A3 (and the rows B0-B3 in some cases) from the proximity effect.

In some embodiments, the rows A0-A3 may be configured to repair (replace) one or more rows of the main array 210 that are determined to be defective. In some cases, the rows A0-A3 may be referred to as a group of redundant rows 320. In this regard, the memory device (e.g., the memory device 200) including the memory array 305b may establish and maintain a mapping relation between the defective row of the main array 210 and one of the redundant rows that replaces the defective row such that the memory device can route access operations directed to the defective row to execute on the redundant row based on the mapping relation. In some embodiments, the group of redundant rows 320 may be part of a redundant plane of the memory device, which may include additional redundant rows for additional array sections (not shown).

In some embodiments, the rows B0-B3 is regarded to provide a buffer zone between the main array 210 and the group of redundant rows 320. As such, the rows B0-B3 may be referred to as a group of buffer rows 315. In this regard, the main array 210 including the rows R0 through Rn−1 abuts a first side of the group of buffer rows 315 and the group of redundant rows 320 abuts a second side of the group of buffer rows 315, which is opposite to the first side.

Absent the group of buffer rows 315 (e.g., if the group of redundant rows 320 is disposed next to the row Rn−1), one of the redundant rows (e.g., the redundant row A0 of the group) may become a victim row if the row Rn−1 becomes an aggressor row due to row hammering activities directed thereto. Thus, the group of buffer rows 315 may separate the group of redundant rows 320 from the main array 210 without losing the continuity in the array pattern—e.g., to avoid the proximity effect. The buffer rows may include functional memory cells, which can be tested, but may not be used to store data (e.g., user data). Accordingly, at least one of the buffer rows (e.g., the buffer row B1 and/or the buffer row B2) may be reserved for the row-copy operation as described herein and the risks associated with row hammering activities directed to the main array 210 can be mitigated. For example, even if the buffer row B1 becomes an aggressor row collecting row hammering activities, there is no risk of corrupting or losing data because neighboring victim buffer rows (e.g., the buffer rows B2 and B0) do not store the data.

Although in the foregoing example embodiments, memory devices include memory arrays (e.g., array sections) with the reserved rows for row-copy operations toward the edge of the memory arrays (or next to the main arrays), the present technology is not limited thereto. For example, the reserved rows for row-copy operations may be present within the main arrays configured to store valid data. In such embodiments, a host device (e.g., a controller) may control, in conjunction with the memory devices, aspects of the row-copy operations, such as ensuring the destination row(s) of the row-copy operations not including valid data, tracking victim rows next to the destination row(s) maintaining accurate data, or the like. In some embodiments, the controller, in conjunction with the memory devices, may allocate certain rows (e.g., two or more consecutive rows) in the main array to be reserved for the row-copy operations and block access operation from reaching the rows that have been allocated (reserved) for the row-copy operations (e.g., with a reduced storage capacity of the memory devices). Further, the reserved rows for row-copy operations may be present anywhere within a memory array of the memory device so long as the reserved rows share a common sensing component (e.g., sense amplifiers) with the memory array.

FIG. 4 is a simplified block diagram schematically illustrating a memory system 400 in accordance with an embodiment of the present technology. Memory system 400 includes a host device 410 operably coupled to a memory module 420 (e.g., a dual in-line memory module (DIMM)). Memory module 420 can include controller circuitry 430 operably connected by a bus 440 to a plurality of memory devices 450. In accordance with aspects of the present disclosure, the memory devices 450 may include memory arrays with main arrays and auxiliary arrays described with reference to FIGS. 2 though 3B so as to perform row-copy operations as described herein. In some embodiments, the memory devices 450 may perform such row-copy operations in response to detecting row hammering activities in the memory arrays. Upon completing the row-copy operations, the memory devices 450 may route access operations related to the row hammering activities to execute on the auxiliary arrays to mitigate risks associated with the row hammering activities to the main arrays.

FIG. 5 illustrates an example machine of a computer system 500 within which a set of instructions, for causing the machine to perform any one or more of the methodologies discussed herein, can be executed. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530. In accordance with aspects of the present disclosure, the main memory 504 may include memory arrays with main arrays and auxiliary arrays described with reference to FIGS. 2 though 3B so as to perform row-copy operations as described herein. In some embodiments, the main memory 504 may be configured to perform such row-copy operations in response to detecting row hammering activities in the memory array. Upon completing the row-copy operations, the main memory 504 may route access operations related to the row hammering activities to execute on the auxiliary arrays to mitigate risks associated with the row hammering activities to the main arrays.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media.

While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Figure 6:
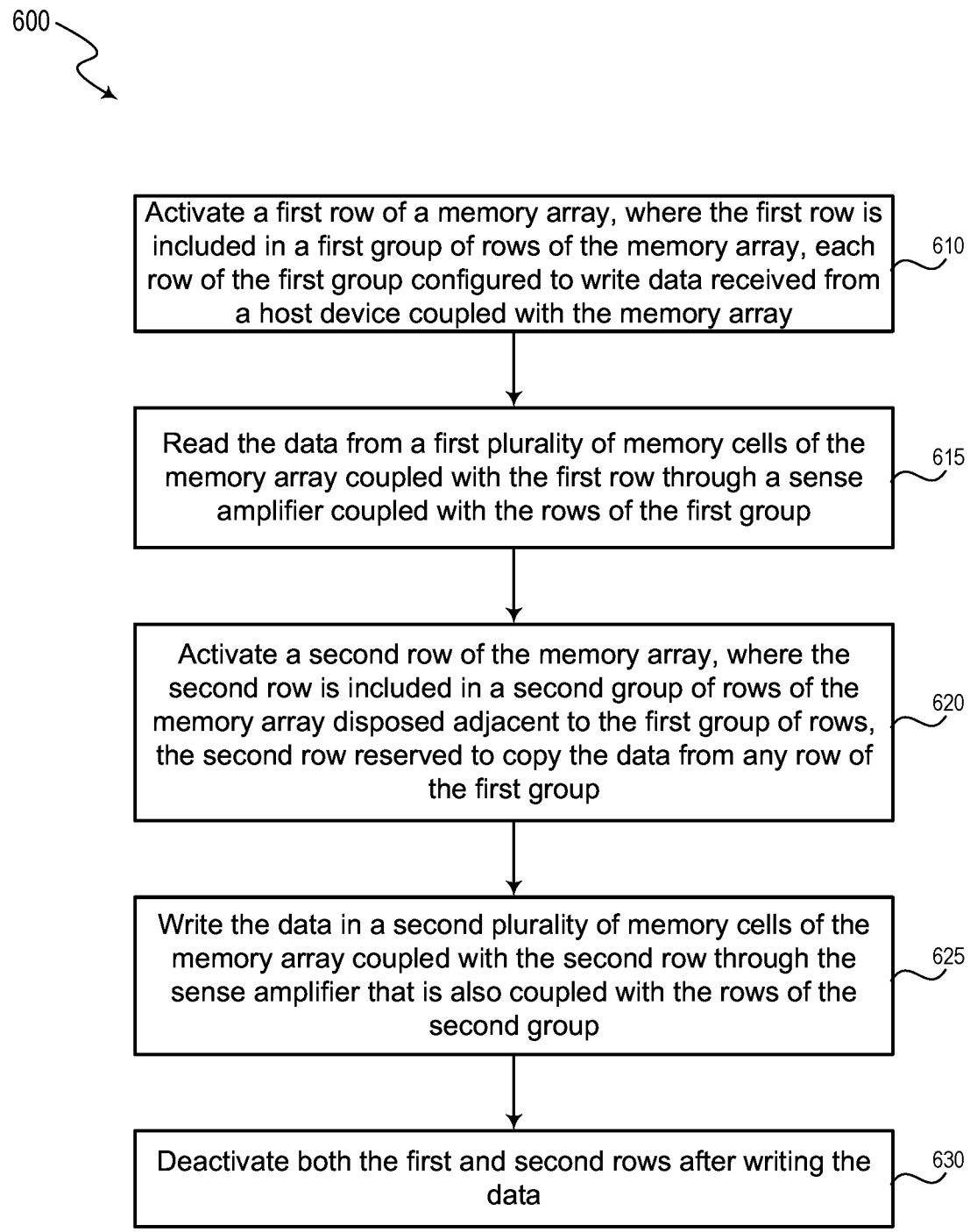
FIG. 6 is a flowchart of a method for performing row-copy operations in accordance with an embodiment of the present disclosure.

FIG. 6 is a flowchart 600 illustrating a method of operating a memory device in accordance with an embodiment of the present technology. The flowchart 600 may be an example of or include aspects of a method that the memory device 100 (or the peripheral circuitry 260) may perform as described with reference to FIGS. 1 through 5.

The method includes activating a first row of a memory array, where the first row is included in a first group of rows of the memory array, each row of the first group configured to write data received from a host device coupled with the memory array (box 610). In accordance with one aspect of the present technology, the activating feature of box 610 can be performed by a peripheral circuitry (e.g., the peripheral circuitry 260) as described with reference to FIGS. 2 through 5.

The method further includes reading the data from a first plurality of memory cells of the memory array coupled with the first row through a sense amplifier coupled with the rows of the first group (box 615). In accordance with one aspect of the present technology, the retrieving feature of box 615 can be performed by a peripheral circuitry (e.g., the peripheral circuitry 260) as described with reference to FIGS. 2 through 5.

The method further includes activating a second row of the memory array, where the second row is included in a second group of rows of the memory array disposed adjacent to the first group of rows, the second row reserved to copy the data from any row of the first group (box 620). In accordance with one aspect of the present technology, the activating feature of box 620 can be performed by a peripheral circuitry (e.g., the peripheral circuitry 260) as described with reference to FIGS. 2 through 5.

The method further includes writing the data in a second plurality of memory cells of the memory array coupled with the second row through the sense amplifier that is also coupled with the rows of the second group (box 625). In accordance with one aspect of the present technology, the storing feature of box 625 can be performed by a peripheral circuitry (e.g., the peripheral circuitry 260) as described with reference to FIGS. 2 through 5.

The method further includes deactivating both the first and second rows after writing the data (box 630). In accordance with one aspect of the present technology, the deactivating feature of box 630 can be performed by a peripheral circuitry (e.g., the peripheral circuitry 260) as described with reference to FIGS. 2 through 5.

In some embodiments, the second group of rows defines a physical boundary of the memory array, and is configured to provide a uniform pitch for a patterning feature of the rows of the first group beyond the physical boundary during a process step to manufacture the memory array. In some embodiments, reading the data and writing the data are performed without activating a data bus of an apparatus including the memory array. In some embodiments, the method may further include saving the data in a data buffer coupled with the sense amplifier, where writing the data in the second plurality of memory cells corresponds to writing the data that has been saved in the data buffer.

In some embodiments, writing the data in the second plurality of memory cells includes concurrently writing the data in the first plurality of memory cells through the sense amplifier. In some embodiments, the method may further include determining that the first row of the first group is accessed repeatedly, where activating the first row is based, at least in part, on determining that the first row is accessed repeatedly. In some embodiments, the method may further include identifying, after deactivating both the first and second rows, an access command directed to the first row, and internally routing the access command to execute on the second row.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD- ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components and blocks illustrated in FIGS. 1-6 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, the word "or" refers to any possible permutation of a set of items. For example, the phrase "A, B, or C" refers to at least one of A, B, C, or any combination thereof, such as any of: A; B; C; A and B; A and C; B and C; A, B, and C; or multiple of any item such as A and A; B, B, and C; A, A, B, C, and C; etc.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

What is claimed is:

1. An apparatus, comprising:
a memory array including groups of rows, wherein:
a first group of rows is configured to write data received from a host device coupled with the memory array; and
a second group of rows is disposed adjacent to the first group of rows, at least one row of the second group reserved to copy the data from any row of the first group;
a sense amplifier coupled with the rows of the first and second groups;
peripheral circuitry coupled with the memory array and the sense amplifier, the peripheral circuitry configured to:
activate a row of the first group, the row coupled with a first plurality of memory cells of the memory array;
read the data from the first plurality of memory cells via the sense amplifier;
activate the at least one row of the second group, the at least one row coupled with a second plurality of memory cells of the memory array;
write the data to the second plurality of memory cells via the sense amplifier; and
deactivate both the row and the at least one row after writing the data.

2. The apparatus of claim 1, wherein the second group of rows defines a physical boundary of the memory array, and is configured to provide a uniform pitch for patterning features for the rows of the first group beyond the physical boundary during a process step to manufacture the memory array.

3. The apparatus of claim 1, wherein the at least one row of the second group is internally addressable within the apparatus and non-addressable from the host device.

4. The apparatus of claim 1, wherein the first group of rows abuts a first side of the second group of rows and a third group of rows abuts a second side of the second group of rows opposite to the first side.

5. The apparatus of claim 4, wherein one or more rows of the third group are reserved to repair one or more rows of the first group.

6. The apparatus of claim 4, wherein the second group of rows is configured to provide a buffer zone for the first and third groups of rows against repeated access directed to a row of the first or third groups.

7. The apparatus of claim 1, wherein the apparatus further comprises a decoder coupled with the memory array and the peripheral circuitry, and wherein the peripheral circuitry is further configured to, transmit a signal to the decoder, the signal related to selecting the at least one row of the second group.

8. The apparatus of claim 7, further comprising:
a row driver coupled with the decoder and configured to drive the at least one row in response to the decoder selecting the at least one row.

9. The apparatus of claim 1, wherein the peripheral circuitry is further configured to determine that the row of the first group is accessed repeatedly, wherein activating the row is based, at least in part, on determining that the row is accessed repeatedly.

10. The apparatus of claim 1, wherein the memory array includes dynamic random access memory (DRAM) cells.

11. The apparatus of claim 1, further comprising:
a data buffer coupled with the sense amplifier, wherein the peripheral circuitry is further configured to save the data in the data buffer such that writing the data in the second plurality of memory cells corresponds to writing the data that has been saved in the data buffer.

12. The apparatus of claim 1, wherein the first and second pluralities of memory cells include the same data as a result of deactivating both the row and the at least one row.

13. A method, comprising:
activating a first row of a memory array, wherein the first row is included in a first group of rows of the memory array, each row of the first group configured to write data received from a host device coupled with the memory array;
reading the data from a first plurality of memory cells of the memory array coupled with the first row through a sense amplifier coupled with the rows of the first group;
activating a second row of the memory array, wherein the second row is included in a second group of rows of the memory array disposed adjacent to the first group of rows, the second row reserved to copy the data from any row of the first group;
writing the data in a second plurality of memory cells of the memory array coupled with the second row through the sense amplifier that is also coupled with the rows of the second group; and
deactivating both the first and second rows after writing the data.

14. The method of claim 13, wherein the second group of rows defines a physical boundary of the memory array, and is configured to provide a uniform pitch for a patterning feature of the rows of the first group beyond the physical boundary during a process step to manufacture the memory array.

15. The method of claim 13, wherein reading the data and writing the data are performed without activating a data bus of an apparatus including the memory array.

16. The method of claim 13, further comprising:
saving the data in a data buffer coupled with the sense amplifier, wherein writing the data in the second plurality of memory cells corresponds to writing the data that has been saved in the data buffer.

17. The method of claim 13, wherein writing the data in the second plurality of memory cells includes concurrently writing the data in the first plurality of memory cells through the sense amplifier.

18. The method of claim 13, further comprising:
determining that the first row of the first group is accessed repeatedly, wherein activating the first row is based, at least in part, on determining that the first row is accessed repeatedly.

19. The method of claim 13, further comprising:
identifying, after deactivating both the first and second rows, an access command directed to the first row; and
internally routing the access command to execute on the second row.

20. An apparatus, comprising:
a memory array including a plurality of rows, wherein at least one row of the plurality is reserved for a row-copy operation and un-addressable via access commands directed to the memory array;
a sense amplifier coupled with the plurality of rows; and
peripheral circuitry coupled with the memory array and the sense amplifier, the peripheral circuitry configured to:
activate a row of the plurality, the row coupled with a first plurality of memory cells of the memory array;
read data from the first plurality of memory cells via the sense amplifier;
activate the at least one row of the plurality, the at least one row coupled with a second plurality of memory cells of the memory array;
write the data in the second plurality of memory cells via the sense amplifier; and
deactivate both the row and the at least one row after writing the data.

* * * * *